United States Patent
Scaman et al.

(10) Patent No.: US 7,187,179 B1
(45) Date of Patent: Mar. 6, 2007

(54) WIRING TEST STRUCTURES FOR DETERMINING OPEN AND SHORT CIRCUITS IN SEMICONDUCTOR DEVICES

(75) Inventors: Michael E. Scaman, Goshen, NY (US); Toshiaki Yanagisawa, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/163,450

(22) Filed: Oct. 19, 2005

(51) Int. Cl.
*G01R 31/08* (2006.01)

(52) U.S. Cl. .......................... 324/512; 257/48; 257/18; 257/751; 324/751; 324/765; 324/763

(58) Field of Classification Search ................ 324/512, 324/751, 765, 763; 257/48, 18, 751; 438/14, 438/17, 18
See application file for complete search history.

(56) References Cited

U.S. PATENT DOCUMENTS

| | | | |
|---|---|---|---|
| 5,313,216 A * | 5/1994 | Wang et al. ......... 343/700 MS |
| 6,030,895 A | 2/2000 | Joshi et al. |
| 6,285,082 B1 | 9/2001 | Joshi et al. |
| 6,300,919 B1 * | 10/2001 | Mehen et al. ................ 343/895 |
| 6,335,569 B1 | 1/2002 | Joshi |
| 6,362,634 B1 | 3/2002 | Jarvis et al. |
| 6,446,327 B2 | 9/2002 | Ahn et al. |
| 6,683,510 B1 * | 1/2004 | Padilla ......................... 333/25 |
| 6,690,187 B2 | 2/2004 | Song et al. |
| 6,693,446 B2 | 2/2004 | Song et al. |
| 6,818,515 B1 * | 11/2004 | Lee et al. .................... 438/284 |
| 6,842,028 B2 | 1/2005 | Song et al. |
| 6,885,275 B1 * | 4/2005 | Chang ......................... 336/200 |
| 6,905,621 B2 * | 6/2005 | Ho et al. ....................... 216/47 |
| 2002/0187582 A1 | 12/2002 | Satya et al. |
| 2003/0001598 A1 | 1/2003 | Weiner et al. |
| 2003/0071261 A1 | 4/2003 | Weiner et al. |
| 2003/0071262 A1 | 4/2003 | Weiner et al. |
| 2003/0085790 A1 * | 5/2003 | Farine ......................... 336/225 |
| 2003/0096436 A1 | 5/2003 | Satya et al. |
| 2003/0097228 A1 | 5/2003 | Satya et al. |
| 2003/0145292 A1 | 7/2003 | Stine et al. |
| 2003/0155927 A1 | 8/2003 | Pinto et al. |
| 2004/0017212 A1 | 1/2004 | Litman et al. |
| 2004/0094762 A1 | 5/2004 | Hess et al. |
| 2004/0121497 A1 | 6/2004 | Ben-Porath et al. |
| 2004/0207414 A1 | 10/2004 | Verma et al. |
| 2004/0229388 A1 | 11/2004 | Guldi et al. |

(Continued)

OTHER PUBLICATIONS

Title: "The Critical Importance of Test Chips in Validating New Interconnect Implementation for Nanometer Design and Manufacturing" Author: Narain Arora, Vice President, R&D, Design for Manufacturing—Cadence Design Systems Date: Undated White Paper Source: http://www.xinitiative.org/Default.aspx?tabid=45.

(Continued)

*Primary Examiner*—Andrew Hirshfeld
*Assistant Examiner*—Thomas F. Valone
(74) *Attorney, Agent, or Firm*—Cantor Colburn LLP

(57) ABSTRACT

A wiring test structure includes a plurality of wiring traces configured in an interleaving spiral pattern. At least one of the plurality of wiring traces configured for open circuit testing therein, and at least a pair of the plurality of wiring traces is configured for short circuit testing therebetween.

13 Claims, 5 Drawing Sheets

U.S. PATENT DOCUMENTS

| | | |
|---|---|---|
| 2004/0262031 A1 | 12/2004 | Gill et al. |
| 2005/0074908 A1 | 4/2005 | Ciplickas et al. |
| 2005/0158888 A1 | 7/2005 | Stine et al. |

OTHER PUBLICATIONS

Title: "Strategy to Optimize the Development, Use, and Dimension of Test Structures to Control Defect Appearance in Backend Process Steps" Author: Christopher Hess: Proc. IEEE/SEMI 1994 Advanced Semiconductor Manufacturing Conference, vol. 5, Nov. 1994.

Title: "FFT-based test of a yield monitor circuit" Author(s): C. Thibeault and A. Payeur—Dept. of Electrical Engineering This paper appears in: Defect and Fault Tolerance in VLSI Systems, 1995, Proceedings, 1995 IEEE International Publication Date: Nov. 13-15, 1995, pp. 243-251.

Title: "Systematic and Random Defect Reduction During the Evolution of Integrated Circuit Technology" Author(s): R. Guldi, et al.—Texas Instruments Incorporated, Dallas Texas This paper appears in: Advanced Semiconductor Manufacturing Conference and Workshop, 1999 IEEE/SEMI Publication Date: 1999 pp. 2-7.

Title: "Using a cryogenic aerosol process to clean copper, low-k materials without damage" Author(s): Jeffery W. Butterbaugh, FSI International This papers appears in the Feb. 2002 MICRO Magazine.com under Technical Articles Source: http://www.micromagazine.com/archive/02/02/butterbaugh.html.

* cited by examiner

WIRING TEST STRUCTURES FOR DETERMINING OPEN AND SHORT CIRCUITS IN SEMICONDUCTOR DEVICES

BACKGROUND

The present invention relates generally to defect detection in semiconductor device manufacturing, and, more particularly, to a wiring test structure for determining open and short circuits in semiconductor devices.

Wiring test structures are typically formed within kerf (peripheral) regions of semiconductor wafers in order to identify various electrical defects (e.g., opens and shorts) that may be indicative of processing problems. Such test structures should preferably facilitate maximizing the efficiency of detection for shorts and opens by allowing for as many tests as necessary, using a minimal amount of area, while still detecting all defects of concern with minimal "escapes" (i.e., missed defects). Moreover, such a structure preferably allows for implementing both open and short testing at the same time if possible and, in addition, for alternating phase shift mask applications (ALT-PSM) for very fine geometries.

Certain test structures in existence, such as comb structures for example, are configured to detect short circuits, but not open circuits. Furthermore, some shorts actually present within a comb structure may escape detection given the presence of other defects such as opens. Conversely, certain other test structures, such as serpentine test structures for example, are configured to detect opens but not shorts. Where shorts are present within a serpentine test structure, opens within the structure may escape detection.

Accordingly, it would be desirable for test structure to be able to detect the presence of either an open or a short with no or virtually no "escapes" due to various patterns of defects or combinations of defects. A test structure that is free of opens and shorts makes the structure authenticable by an electronic open and shorts test prior to its use for parametric testing (e.g., line resistance, capacitance). In addition, a test structure that is configured to allow for very few escapes of opens and shorts allows the structure to be a more useful process monitor, since a parametric measurement is less likely to be affected by a defect as the defects themselves would be detected with high confidence. It would further be desirable if such a structure could be configured in a manner consistent with ALT-PSM use.

SUMMARY

The foregoing discussed drawbacks and deficiencies of the prior art are overcome or alleviated by a wiring test structure including a plurality of wiring traces configured in an interleaving spiral pattern. At least one of the plurality of wiring traces configured for open circuit testing therein, and at least a pair of the plurality of wiring traces is configured for short circuit testing therebetween.

In still another embodiment, a method for forming a wiring test structure, includes forming a plurality of wiring traces in an interleaving spiral pattern, configuring at least one of the plurality of wiring traces for open circuit testing therein, and configuring at least a pair of the plurality of wiring traces for short circuit testing therebetween.

BRIEF DESCRIPTION OF THE DRAWINGS

Referring to the exemplary drawings wherein like elements are numbered alike in the several Figures.

DETAILED DESCRIPTION

Disclosed herein is a wiring test structure that is capable of efficiently detecting opens and shorts therein. Briefly stated, an exemplary embodiment of the test structure utilizes inwardly spiraling patterns to test for opens and shorts. As will be appreciated hereinafter, the spiral structure is efficient in at least two respects. First, it is difficult to miss a defect with a spiral configuration. Second, because each line in the spiral structure may be used to test for both opens and shorts, it is more efficient than traditional serpentine and comb test patterns in terms of area as well as in terms of the significantly reduced possibility of escapes of a short or open.

Moreover (and in addition to being particularly suited to alternating phase mask applications), the interleaved spiral test structure also has advantages as a parametric process monitor for line widths, as well as being extendable to parametric measurements such as resistance and capacitance. This approach particularly applies to test sites for FET gate and metallization layers, and may also be used for parametric tests such as line resistance and capacitance measurements for gate conductor-to-gate conductor, metallization line-to-line, and/or gate conductor-to-diffusion measurements.

In order to detect both opens and shorts, the double spiral test structures in an exemplary embodiment may be implemented primarily in one plane, but would have a small amount of wiring in another plane. Alternatively, a double spiral test structure may be constructed exclusively in one plane, but would either be primarily designed as a test structure for opens (as an alternative to a serpentine structure) or as a test structure for shorts (as an alternative to a comb structure).

Figure 1:
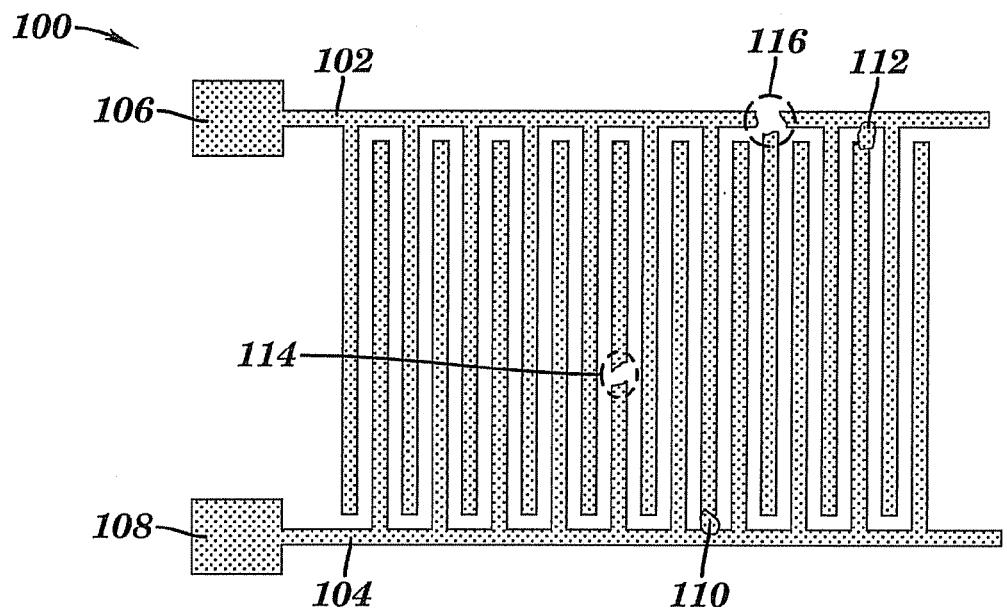
FIG. 1 is a schematic diagram of a conventionally configured comb wiring test structure used for the detection of shorts.

Referring initially to FIG. 1, there is shown a conventionally configured comb test structure 100 used for the detection of shorts. As is shown, the comb structure 100 includes a first net 102 and a second net 104 having interlocking fingers, but that are nominally electrically isolated from one another. The first net 102 is probed at pad 106, while the second net 104 is probed at pad 108 using test equipment well known in the art. The structure 100 would nominally be able to detect a short such as at 110 or 112, but is not able to detect an open such as at 114 or 116. Moreover, the presence of an open at 116 would actually render test structure 100 ineffective in detecting the short at 112, thus illustrating an example of an escape. Accordingly, some combinations of defects in structure 100 will result in an escape for shorts.

While a comb test structure such as that shown in FIG. 1 could be used to measure the capacitance between pads 106 and 108 (assuming there are no shorts), the presence of any opens would mean that the measured capacitance would not represent the average capacitance between lines, thus introducing an uncertainty in how such a parametric measurement relates to the actual process being monitored. In turn, this decreases the usefulness of the structure and may possibly result in additional labor, in terms of inspection of test structures prior to use as a process monitor to assure their integrity. In addition, where an alternating phase shift mask (ALT-PSM) is used to pattern the comb test structure, additional space must be allowed from the line ends of the combs to the interleaving target.

Figure 2:
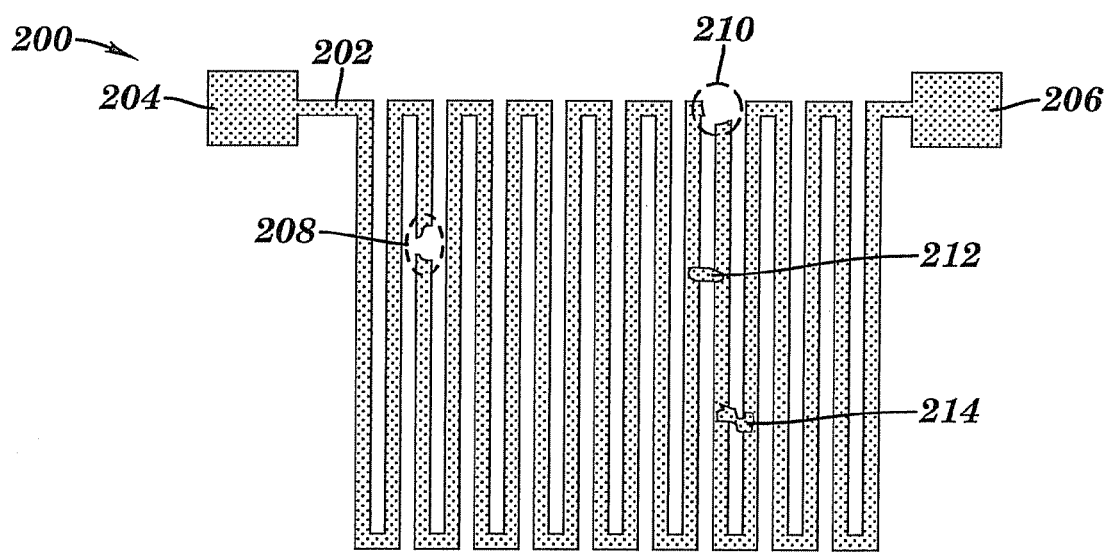
FIG. 2 is a schematic diagram of a conventionally configured serpentine wiring test structure used for the detection of opens.

FIG. 2 illustrates a conventionally configured serpentine test structure 200 used for the detection of opens. As opposed to the comb structure 100 of FIG. 1, the serpentine test structure 200 of FIG. 2 has a single net trace 202 that is nominally electrically continuous, and is probed at pads 204 and 206. Such a serpentine structure is useful for detection of opens such as shown at 208 and 210, but is not configured to detect shorts, such as at 212 and 214. Moreover, the presence of a short at 212 would actually render test structure 200 ineffective in detecting the open at 210, thus illustrating another example of an escape.

Assuming the serpentine test structure 200 is free of defects, it could be used as a parametric test for process monitoring of resistance, line width, and/or line cross sectional area monitoring. However, the usefulness of the structure 200 as a process monitor may be undermined by the presence of undetectable shorts, such as at 212 and 214, or a missed open such as at 210 (due to the presence of short 212). As is the case with the comb structure 100, such defects may possibly result in additional labor through inspection of test structures 200, prior to their use as a process monitoring device to assure their integrity.

Figure 3:
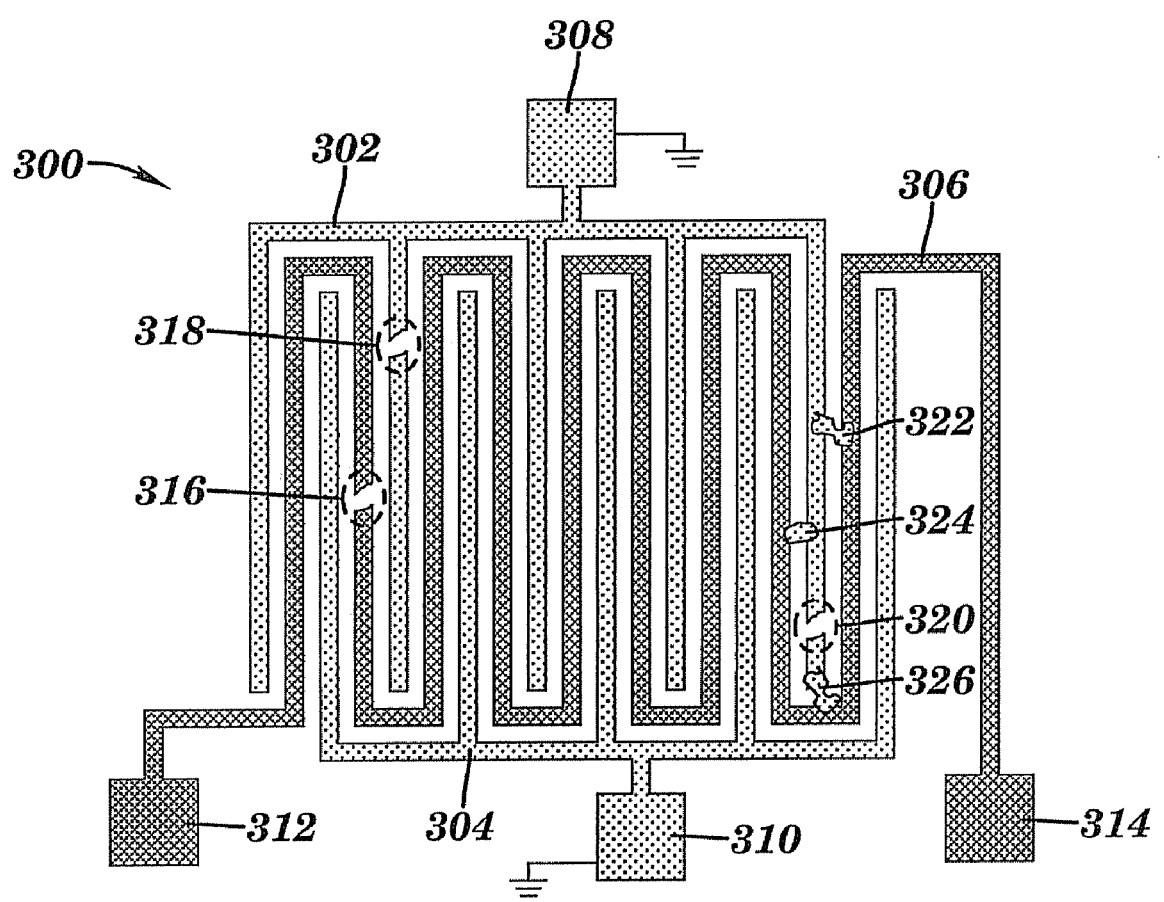
FIG. 3 is a schematic diagram of a conventionally configured, hybrid comb/serpentine wiring test structure used for the detection of shorts and opens.

Referring now to FIG. 3, there is shown still another conventionally configured test structure 300 that provides some capability of testing both opens (at certain locations thereof) and shorts (at certain other locations thereof). As is shown, the hybrid test structure 300 includes a comb component (i.e., lines 302, 304), as well as a serpentine component (i.e., line 306). The serpentine line 306 runs between the intermeshed lines 302, 304. For testing purposes, lines 302 and 304 may be probed at pads 308 and 310, respectively, while line 306 may be probed at pads 312 and 314. As will be appreciated, although the structure 300 can detect certain opens and certain shorts, not all conductive traces within the structure 300 may be tested for both opens and shorts.

In particular, structure 300 is capable of detecting an open, such as shown at 316 along the serpentine line 306 (by probing pads 312 and 314), but not opens at 318 or 320, since they are along the comb line 302. On the other hand, the structure 300 would detect a short such as shown at 322 and 324. However, a short such as at 326 could be missed in the event that the open at 320 was also present. Thus, despite the fact that hybrid test structure 300 can detect both opens and shorts to a certain extent, there are also combinations of defects that can remain undetected. Furthermore, while each trace in the structure 300 may be tested for shorts, only about half the traces in the structure 300 may be used for open testing, since opens cannot be detected in lines 302 and 304.

In summary, none of the conventional structures shown in FIGS. 1–3 (i.e., comb, serpentine or hybrid) provides the capability of using all of the conductive traces for both opens and short testing, therefore limiting the efficient packing of both open and short testing in one small area. In addition, each of the aforementioned test structures is susceptible to missing a defect, both systematically (since not all lines test for all defects) and in combination with some other defects (thereby limiting the use of such a structure for process monitoring purposes).

Figure 4A:
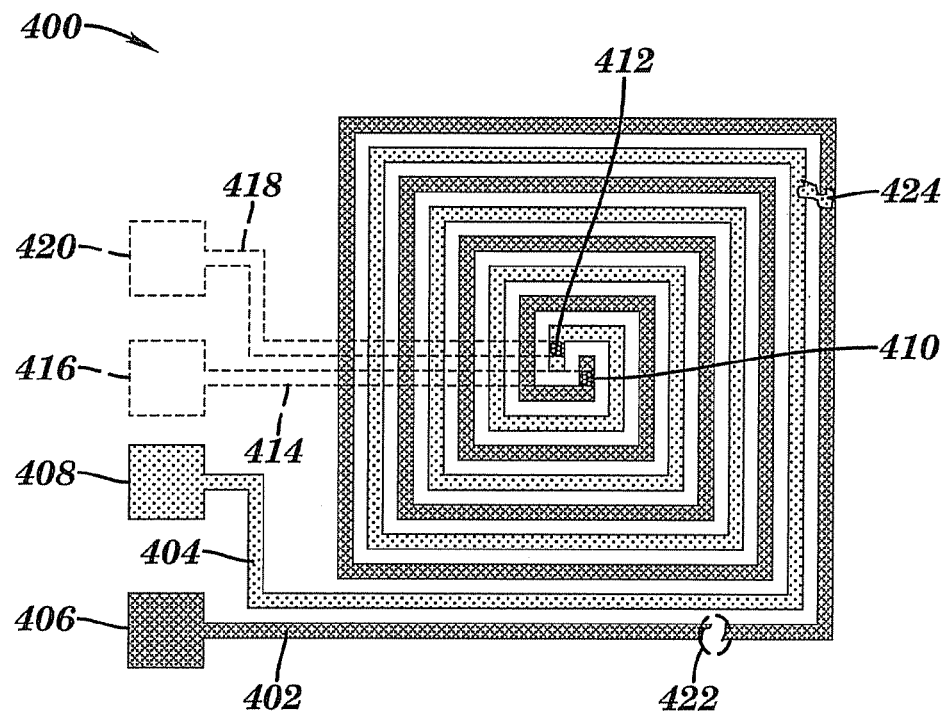
FIG. 4(a) is a schematic diagram of a wiring test structure, in accordance with an embodiment of the invention.

Accordingly, FIG. 4(a) is schematic diagram illustrating a wiring test structure 400, in accordance with an embodiment of the invention. As is shown, the test structure 400 is characterized by alternating, inwardly spiraling lines 402, 404. In the embodiment depicted, the spiraling lines 402, 404 are formed within a first wiring plane defined in the wafer, as are the respective probing pads 406, 408 for lines 402, 404. As lines 402 and 404 spiral inward toward a central location in the first wiring plane, they are nominally electrically isolated from one another. Eventually, line 402 meets with a first via 410, while line 404 meets with a second via 412. Vias 410 and 412 extend into a second wiring plane, which may be located at either a lower metallization level with respect to the first wiring plane or an upper metallization level with respect to the first wiring plane.

In other words, vias 410 and 412 may extend upward or downward to a different metal level than that containing lines 402 and 404. In either case, a wiring trace 414 (on a different wiring level than lines 402 and 404) then connects via 410 to probe pad 416. Correspondingly, another wiring trace 418 connects via 412 to probe pad 420. It will be noted that traces 414, 418 and probe pads 416, 420 are preferably located on the same metal level as one another. Thus configured, test structure 400 in one aspect provides for complete and thorough testing for opens present therein. A first (and nominally continuous) wiring path is defined by pad 406, line 402, via 410, trace 414 and pad 416. As such, an opens along this first path are detectable through suitable probing at pads 406 and 416. Further, a second (and nominally continuous) wiring path is defined by pad 408, line 404, via 412, trace 418 and pad 420. Opens along this second path are detectable through suitable probing at pads 408 and 420.

Furthermore, the test structure 400 of FIG. 4(a) also provides for complete detection of shorts between any two adjacent traces in the spiral configuration by probing at pads 406 and 408. Even where an open is detected (such as at 422, for example), this condition would not prevent the detection of a short at 424, since the short is identifiable through probing at pads 408 and 416.

It will be noted at this point that the spiral test structure 400 is depicted as spiraling inwardly at right angles. However, other spiraling configurations are also contemplated, such as circular spirals or spirals at other angles (e.g., 45-degree spirals that result in an octagonal shaped test structure). One particular advantage of the right angle, square spiral configuration is the relative ease of patterning and the compatibility with ALT-PSM mask processing. Because of the alternating, double lines, one skilled in the art of ALT-PSM mask usage could fabricate this type of test structure at finer geometries, as such a structure lends itself to accommodating two types of alternating mask areas.

Figure 4B:
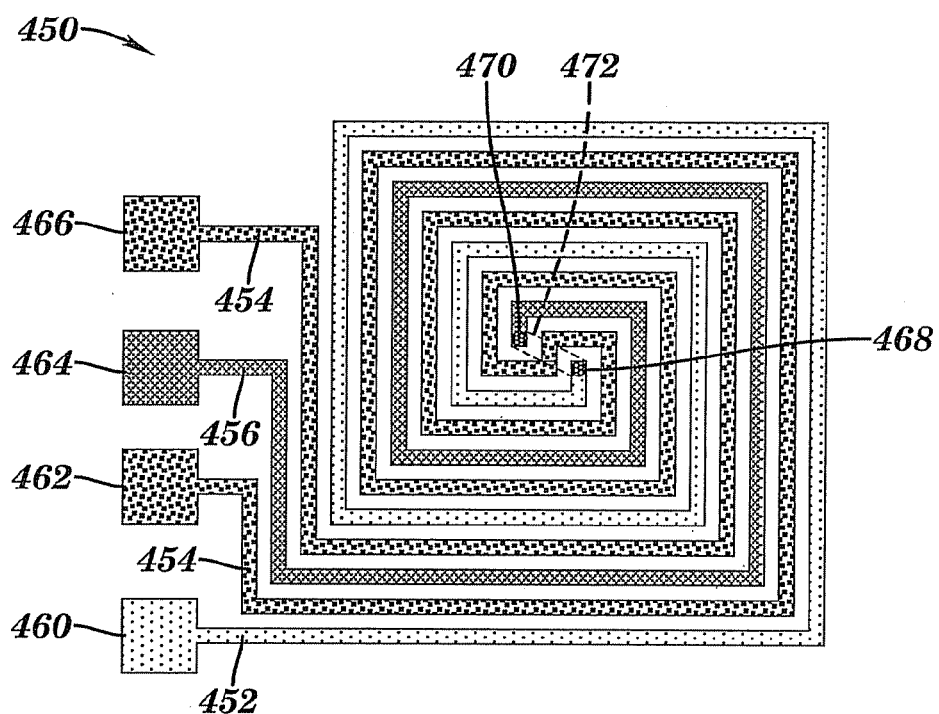
FIG. 4(b) is a schematic diagram of an alternative embodiment of the test structure of FIG. 4(a)

FIG. 4(b) is schematic diagram illustrating an alternative embodiment of a wiring test structure 450 for providing efficient open and short detection, but having less "out of plane" wiring than the embodiment 400 of FIG. 4(a). In particular, test structure 450 provides inwardly spiraling lines 452, 454 and 456 formed within a first wiring plane defined in the wafer, as are probing pads 460, 462, 464 and 466. As lines 452 and 456 spiral inward toward a central location in the first wiring plane, they are initially (nominally) electrically isolated from one another. The third line 454 is interleaved with itself, in that it begins at pad 462, spirals inward to the central location, then spirals back outward and ends at pad 466. As a result, a first (and nominally continuous) wiring path is defined by pad 462, line 454 and pad 466. This first path is thus located entirely within the first wiring plane.

In contrast, the other two lines (lines 452 and 456) spiral inward toward the center of the structure 450 until they approach opposite sides of the central location of line 454. At this point, vias 468 and 470 respectively continue the path of lines 452 and 456 into a second wiring plane, which again may either be located above or below the first wiring plane that contains the spiral patterns. Finally, a small wiring jog 472 is then used to connect lines 454 and 458 in the second wiring plane. Thereby, a second (and nominally continuous) wiring path is defined by pad 460, line 452, via 468, jog 472, via 470, line 456 and pad 464. This second path is located mostly within the first wiring plane, but has some wiring in the second wiring plane (i.e., jog 472) in order to cross over the first path without shorting thereto.

From a functional standpoint, the test structure 450 of FIG. 4(b) provides the same efficient and complete open and short testing capability as the test structure 400 of FIG. 4(a). For instance, an opens check of line 454 is implemented through probing of pads 462, 466, while an opens check of lines 452/456 is implemented through probing of pads 460, 464. Shorts between any two adjacent traces are detectable through an appropriate probe of a pad in the first wiring path and a pad in the second wiring path. As is the case with test structure 400, test structure 450 is also particularly suitable for efficient implementation with ALT-PSM mask processing. Depending upon the nature and configuration of the probing test equipment, it may be more advantageous to have each of the four probe pads in the same wiring plane, as shown in FIG. 4(b), or to have the pads oriented more vertically, as shown in FIG. 4(a).

Although the embodiments of FIGS. 4(a) and 4(b) provide complete, efficient open and short testing capability (in addition to process monitoring capability), at least a portion of the structures is formed within a separate wiring plane than with respect to the main interleaved spiral traces. In the event that it is desirable to fabricate the entire structure within a single wiring level (depending on which particular metal level the test structure is to be located), the spiral configuration may still be used. However, in so doing, there will be a resulting tradeoff in complete functionality with respect to either open testing or short testing.

Figure 5A:
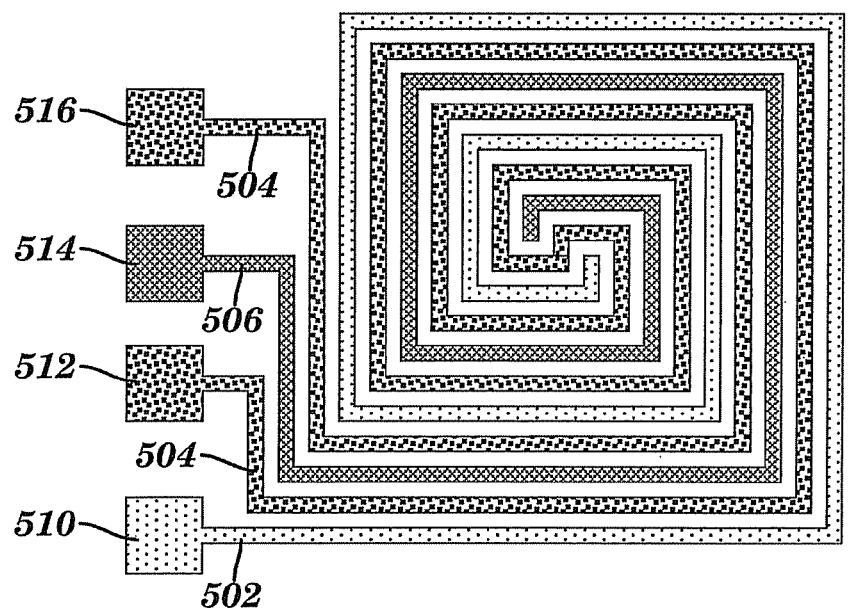
FIG. 5(a) is a schematic diagram of a wiring test structure, in accordance with an alternative embodiment of the invention.

For example, FIG. 5(a) is schematic diagram of a wiring test structure 500 for providing efficient open and short detection, in accordance with an alternative embodiment of the invention. As will be noted, the spiral test structure 500 is substantially the same as the embodiment 450 of FIG. 4(b), with the exception that the out of plane wiring is not provided. Thus, while interleaved line 504 still defines a nominally continuous wiring path between pads 512 and 516, lines 502 (connected to pad 510) and 506 (connected to pad 514) are now electrically isolated from one another (as well as from line 504). Although this embodiment still provides for substantially complete testing of shorts between any adjacent pair of traces, only line 504 is configured for opens testing. In addition, a combination of defects could also result in one or more of such defects escaping detection. In this sense, test structure 500 provides a similar functionality as the hybrid structure 300 of FIG. 3. However, the spiral structure 500 still represents an improvement over the conventional hybrid structure in terms of area efficiency, as well as compatibility with an efficient implementation using ALT-PSM mask processing.

Figure 5B:
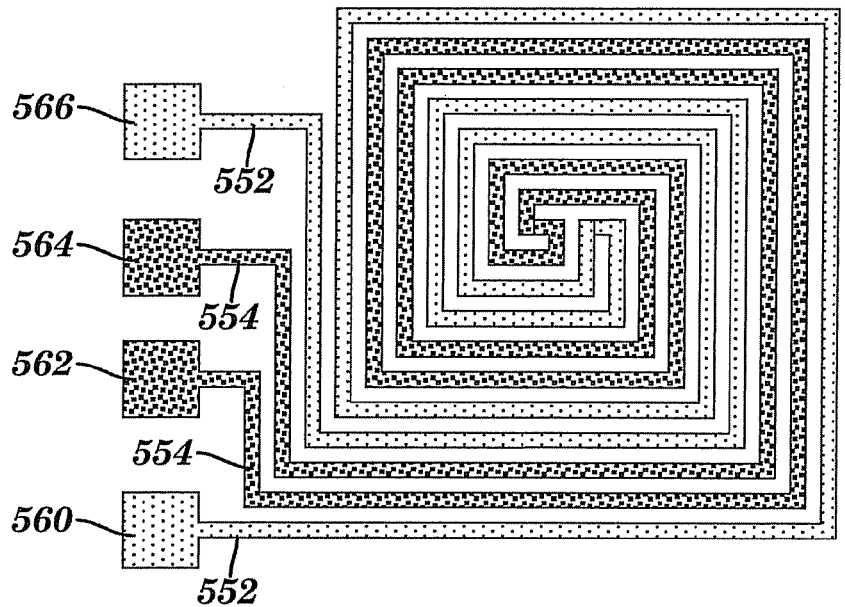
FIG. 5(b) is a schematic diagram of an alternative embodiment of the test structure of FIG. 5(a)

Finally, in the event that complete coverage for opens testing is somewhat more desirable than complete coverage for shorts testing (and assuming the structure is to be formed entirely within a single wiring plane), FIG. 5(b) is schematic diagram of a wiring test structure 550, in accordance with still an alternative embodiment of the invention. As is shown, interleaved line 552 defines a first nominally continuous wiring path between pads 560, 566), while interleaved line 554 defines a second nominally continuous wiring path (between pads 562, 564). Thus configured, the entire spiral test structure 550 may be tested for opens. The tradeoff in this embodiment is that only half the potential number of shorts between adjacent traces may be detected. For instance, a short between line 552 and 554 is detectable. However, a short between interleaved portions of line 552 or between interleaved portions of line 554 is not detectable.

Again, while the single wiring plane embodiments of FIGS. 5(a) and 5(b) do not provide the full range of both open and short testing as do the multiple wiring plane embodiments of FIGS. 4(a) and 4(b), there is still an improvement over the conventional hybrid embodiment of FIG. 3. There is significantly less opportunity for missing an open or short and, in addition, more reliability of resistive measurements made in the double spiral test structure. Not only would opens in the comb portion of the conventional hybrid structure be missed, but an open in the comb could also lead to an escape of a short between the comb portion and the serpentine portion of the hybrid structure being missed. In contrast, there would have to be defects that cause the connectivity of the two wiring paths of FIG. 5(b), for example, to switch an even number of times in order to escape detection. This is a more unlikely scenario for an escape to exist than would be the case for the conventional comb, serpentine or hybrid test structures.

Figure 5C:
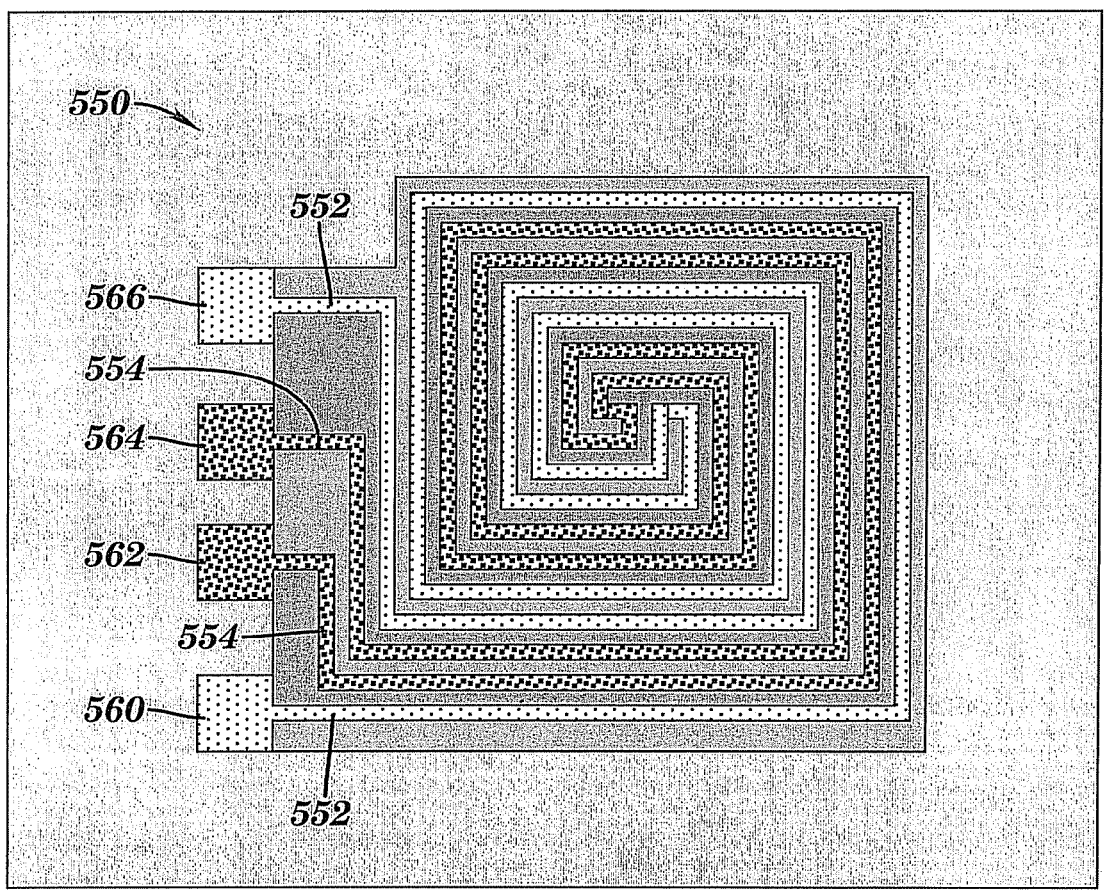
FIG. 5(c) illustrates an exemplary ALT-PSM mask set that may be used to form the test structure of FIG. 5(b).

As discussed above, the interleaved spiral configuration for the test structure embodiments are compatible with an efficient implementation using ALT-PSM processing. For example, the test structure of FIG. 5(b) is shown in FIG. 5(c), in addition to an exemplary configuration of a set of ALT-PSM masks including a block mask, a 180° phase shift mask and a 0° phase shift mask, as illustrated by the legend therein.

Although the disclosed test structure embodiments have been described in terms of various levels of chip manufacturing, it will be appreciated that these structures could also be in conjunction with other types of electronic packaging, such as (for example) printed circuit boards or special electronic monitors on a given product (e.g., for detecting corrosion or some other condition during transport or in situ use).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A wiring test structure, comprising:
   a plurality of wiring traces configured in a spiral pattern, with at least one of said plurality of wiring traces configured for open circuit testing therein, and at least a pair of said plurality of wiring traces configured for short circuit testing therebetween;
   a first wiring plane containing said plurality of spiral pattern traces;
   a second wiring plane having at least one conductive trace connected to at least one of said plurality of spiral pattern traces through at least one via;
   a first wiring path, said first wiring path including a first probe pad within said first wiring plane, a first of said spiral pattern traces, a first via, a first conductive trace in said second wiring plane, and a third probe pad in said second wiring plane; and
   a second wiring path, said second wiring path including a second probe pad within said first wiring plane, a second of said spiral pattern traces, a second via, a second conductive trace in said second wiring plane, and a fourth probe pad in said second wiring plane.

2. The wiring test structure of claim 1, wherein each of said plurality of wiring traces are configured to spiral in an inward direction to a central location from a corresponding probe pad connected thereto.

3. The wring test structure of claim 2, wherein said plurality of wiring traces spiral inward at right angles.

4. A wiring test structure, comprising:
   a plurality of wiring traces configured in a spiral pattern, with at least one of said plurality of wiring traces configured for open circuit testing therein, and at least a pair of said plurality of wiring traces configured for short circuit testing therebetween;
   a first wiring path, said first wiring path including a first probe pad, a first of said spiral pattern traces and a second probe pad, said first spiral pattern trace being interleaved with itself;
   a second wiring path, said second wiring path including a third probe pad and a second of said spiral pattern traces; and
   a third wiring path, said third wiring path including a fourth probe pad and a third of said spiral pattern traces;
   each of said first, second and third wiring paths formed in a single wiring plane.

5. The wiring test structure of claim 4, wherein:
   each of said spiral pattern traces is configured for short circuit testing with respect to an adjacent trace thereto; and
   said first wiring path is configured for open circuit testing therein.

6. A method for forming a wiring test structure, the method comprising:
   forming a plurality of wiring traces in a spiral pattern, configuring at least one of said plurality of wiring traces for open circuit testing therein, and configuring at least a pair of said plurality of wiring traces for short circuit testing therebetween;
   a first wiring plane containing said plurality of spiral pattern traces;
   a second wiring plane having at least one conductive trace connected to at least one of said plurality of spiral pattern traces through at least one via;
   configuring a first wiring path, said first wiring path including a first probe pad within said first wiring plane, a first of said spiral pattern traces, a first via, a first conductive trace in said second wiring plane, and a third probe pad in said second wiring plane; and
   configuring a second wiring path, said second wiring path including a second probe pad within said first wiring plane, a second of said spiral pattern traces, a second via, a second conductive trace in said second wiring plane, and a fourth probe pad in said second wiring plane.

7. The method of claim 6, wherein each of said plurality of wiring traces are configured to spiral at right angles in an inward direction to a central location from a corresponding probe pad connected thereto.

8. The method of claim 7, wherein said plurality of wiring traces are formed using an alternating phase shift modulation (ALT-PSM) mask.

9. A method for forming a wiring test structure, the method comprising:
   forming a plurality of wiring traces in a spiral pattern, configuring at least one of said plurality of wiring traces for open circuit testing therein, and configuring at least a pair of said plurality of wiring traces for short circuit testing therebetween;
   configuring a first wiring path, said first wiring path including a first probe pad, a first of said spiral pattern traces, and a second probe pad, said first spiral pattern trace being interleaved with itself;
   configuring a second wiring path, said second wiring path including a third probe pad and a second of said spiral pattern traces; and
   configuring a third wiring path, said third wiring path including a fourth probe pad and a third of said spiral pattern traces;
   each of said first, second and third wiring paths formed in a single wiring plane;
   wherein each of said spiral pattern traces is configured for short circuit testing with respect to an adjacent trace thereto and said first wiring path is configured for open circuit testing therein.

10. The method of claim 6, wherein said plurality of spiral pattern traces are further configured for at least one of resistance measurements and capacitance measurements in the absence of open circuits and short circuits therein.

11. The wiring test structure of claim 4, wherein each of said plurality of wiring traces are configured to spiral in an inward direction to a central location from a corresponding probe pad connected thereto.

12. The wiring test structure of claim 11, wherein said plurality of wiring traces spiral inward at right angles.

13. The method of claim 9, wherein each of said plurality of wiring traces are configured to spiral at right angles in an inward direction to a central location from a corresponding probe pad connected thereto.

* * * * *